(12) United States Patent
Chun et al.

(10) Patent No.: US 11,417,562 B2
(45) Date of Patent: Aug. 16, 2022

(54) SUBSTRATE SUPPORTING APPARATUS

(71) Applicant: JUSUNG ENGINEERING CO., LTD., Gwangju-si (KR)

(72) Inventors: Dong Seok Chun, Gwangju-si (KR); Jeong Mi Kim, Gwangju-si (KR); Jong Sik Kim, Gwangju-si (KR); Won Woo Jung, Gwangju-si (KR); Min Ho Cheon, Gwangju-si (KR); Chul Joo Hwang, Seongnam-si (KR)

(73) Assignee: JUSUNG ENGINEERING CO., LTD.

( * ) Notice: Subject to any disclaimer, the term of this patent is extended or adjusted under 35 U.S.C. 154(b) by 374 days.

(21) Appl. No.: 16/613,115

(22) PCT Filed: Jun. 25, 2018

(86) PCT No.: PCT/KR2018/007186
§ 371 (c)(1),
(2) Date: Nov. 12, 2019

(87) PCT Pub. No.: WO2018/236201
PCT Pub. Date: Dec. 27, 2018

(65) Prior Publication Data
US 2021/0082738 A1    Mar. 18, 2021

(30) Foreign Application Priority Data

Jun. 23, 2017  (KR) .................. 10-2017-0079595

(51) Int. Cl.
*H01L 21/687* (2006.01)
*H01J 37/32* (2006.01)

(52) U.S. Cl.
CPC .. *H01L 21/68757* (2013.01); *H01J 37/32724* (2013.01); *H01L 21/68735* (2013.01); *H01J 2237/002* (2013.01)

(58) Field of Classification Search
CPC ........ H01L 21/68757; H01L 21/68735; H01L 21/20; H01L 21/67; H01L 21/68
(Continued)

(56) References Cited

U.S. PATENT DOCUMENTS

2004/0003780 A1   1/2004  Yudovsky et al.
2015/0187631 A1   7/2015  Ranish et al.

FOREIGN PATENT DOCUMENTS

CN       103074673 A       5/2013
JP      2010225645 A   *  10/2010
(Continued)

OTHER PUBLICATIONS

Munro, R., & Dapkunas, S. (1993). Corrosion characteristics of silicon carbide and silicon nitride. Journal of Research of the National Institute of Standards and Technology, 98(5), 607. https://doi.org/10.6028/jres.098.040 (Year: 1993).*

(Continued)

*Primary Examiner* — Lee D Wilson
*Assistant Examiner* — Jonathan G Santiago Martinez
(74) *Attorney, Agent, or Firm* — Renaissance IP Law Group LLP (57) ABSTRACT

One embodiment of a substrate supporting apparatus comprises: a support member for supporting a substrate; and a temperature compensating member disposed at the edge of the support member, and compensating the temperature of the substrate, wherein the support member may be made of a light-transmissive material, the temperature compensating member may be made of an opaque material, and the surface of the temperature compensating member may be made of a material having corrosion resistance against a cleaning gas.

19 Claims, 3 Drawing Sheets

(58) Field of Classification Search
USPC .................................................. 269/289 R
See application file for complete search history.

(56) References Cited

FOREIGN PATENT DOCUMENTS

| | | | |
|---|---|---|---|
| JP | 2010225645 | A | 10/2010 |
| JP | 2013070007 | A | 4/2013 |
| JP | 2016065276 | A | 4/2016 |
| JP | 2017076652 | A * | 4/2017 |
| JP | 2017076652 | A | 4/2017 |
| KR | 20030059745 | A | 7/2003 |
| KR | 101002748 | B1 * | 12/2010 |
| KR | 101002748 | B1 | 12/2010 |

OTHER PUBLICATIONS

Wikipedia contributors, (n.d.). List of thermal conductivities. Wikipedia. Retrieved Jan. 14, 2022, from https://en.wikipedia.org/wiki/List_of_thermal_conductivities (Year: 2022).*

Connor, N. (n.d.). Quartz | Density, Heat Capacity, Thermal Conductivity. Material Properties. Retrieved Jan. 14, 2022, from https://material-properties.org/quartz-density-heat-capacity-thermal-conductivity/ (Year: 2022).*

* cited by examiner

SUBSTRATE SUPPORTING APPARATUS

TECHNICAL FIELD

Embodiments relate to a substrate supporting apparatus that compensates for or further increases the temperature of the edge of a substrate in order to achieve a uniform temperature distribution over the substrate.

BACKGROUND ART

The content described in this section merely provides background information regarding embodiments, and does not constitute the prior art.

In general, a semiconductor memory device, a liquid crystal display device, an organic light-emitting device, or the like is produced by stacking a structure on a substrate in a desired configuration through a plurality of semiconductor processes.

A semiconductor-manufacturing process includes a process of depositing a predetermined thin film on a substrate, a photolithography process of exposing a selected region of the thin film, and an etching process of removing the selected region of the thin film. A substrate-processing process for manufacturing this semiconductor is performed by a substrate-processing apparatus, which includes a chamber having an optimal environment for a corresponding process.

An object to be processed, i.e. a substrate, and a substrate supporting apparatus for supporting the substrate seated thereon are provided inside the chamber, and process gas including a source material is sprayed on the substrate. A deposition process and an etching process are performed on the substrate by the source material included in the process gas.

DISCLOSURE

Technical Problem

Embodiments relate to a substrate supporting apparatus that compensates for or further increases the temperature of the edge of a substrate in order to achieve a uniform temperature distribution over the substrate.

However, the objects to be accomplished by the embodiments are not limited to the above-mentioned object, and other objects not mentioned will be clearly understood by those skilled in the art to which the embodiments pertain from the following description.

Technical Solution

According to an embodiment, a substrate supporting apparatus includes a support member for supporting a substrate and a temperature compensation member disposed at the edge of the support member to compensate for the temperature of the substrate, wherein the support member is formed of a light-permeable i.e., light-transmissive or transparent material, the temperature compensation member is formed of a light-impermeable i.e., an opaque material for blocking out light, and the temperature compensation member includes a surface formed of a material having resistance to corrosion by cleaning gas.

The temperature compensation member may include a surface coated with a material having resistance to corrosion by cleaning gas.

The support member may be formed of quartz, and the temperature compensation member may be formed of at least one selected from the group consisting of silicon carbide (SiC), black ceramic, black quartz, and graphite.

The substrate and the temperature compensation member may be spaced apart from each other such that the side surface of the substrate and the side surface of the temperature compensation member face each other.

The temperature compensation member may be formed of a material having thermal conductivity higher than the material of the support member.

The temperature compensation member may include a body portion formed of the same material as the support member, and a coating layer coated on the surface of the body portion, the coating layer being formed of a different material from the body portion.

The coating layer may be formed of a material having thermal conductivity higher than the material of the body portion.

The support member and the body portion may be formed of quartz, and the coating layer may be formed of a black body.

The temperature compensation member may be formed in the shape of a ring that is disposed so as to surround the substrate.

The support member may include a seat portion on which the substrate is seated, and a depressed portion having a ring shape, the depressed portion being formed between the seat portion and the inner side surface of the temperature compensation member.

The substrate may be disposed on the depressed portion such that the side and bottom surfaces of the edge of the substrate are exposed.

The temperature compensation member may dissipate heat, and the heat dissipated from the temperature compensation member may heat the top, side and bottom surfaces of the edge of the substrate.

The temperature compensation member and the substrate may be disposed on the top surface of the support member such that the bottom surface of the temperature compensation member and the bottom surface of the substrate are disposed at the same height in the vertical direction.

According to another embodiment, a substrate supporting apparatus includes a support member for supporting a substrate and a temperature compensation member disposed at the edge of the support member to compensate for the temperature of the edge of the substrate, the temperature compensation member being formed of a different material from the support member, wherein the support member includes a seat portion on which the substrate is seated and a depressed portion having a ring shape, the depressed portion being formed between the seat portion and the inner side surface of the temperature compensation member, the temperature compensation member includes a surface formed of a material having resistance to corrosion by cleaning gas, and the substrate is disposed on the depressed portion such that the side and bottom surfaces of the edge of the substrate are exposed and are heated by heat dissipated from the temperature compensation member.

The temperature compensation member may be formed of a material having thermal conductivity higher than the material of the support member.

The support member may be formed of quartz, and at least a portion of the temperature compensation member may be formed of a black body.

The temperature compensation member may include a body portion formed of the same material as the support member, and a coating layer coated on the surface of the body portion, the coating layer being formed of a different material from the body portion. The coating layer may be formed such that a portion of the coating layer is disposed on the side and lower surfaces of the depressed portion and such that one end of the coating layer comes into contact with the bottom surface of the edge of the substrate.

The coating layer may be formed of a material having thermal conductivity higher than the material of the body portion.

The temperature compensation member may include a surface coated with a material having resistance to corrosion by cleaning gas.

The black body may include at least one selected from the group consisting of silicon carbide (SiC), ceramic, aluminum oxide (Al2O3), graphite, and quartz.

Advantageous Effects

According to the embodiment, the temperature compensation member further heats the edge of the substrate in order to compensate for the temperature of the edge of the substrate, which is lower than the temperature of the center of the substrate, thereby achieving uniform temperature distribution over the entire region of the substrate or further increasing the temperature of the edge of the substrate.

According to the embodiment, since the light-impermeable i.e., opaque temperature compensation member has a higher temperature than the light-permeable i.e., light-transmissive or transparent support member, heat transfer from the light-impermeable temperature compensation member to the edge of the substrate may be effectively realized, thereby achieving uniform temperature distribution over the entire region of the substrate or further increasing the temperature of the edge of the substrate.

According to the embodiment, the top, side and bottom surfaces of the edge of the substrate are heated by the heat dissipated from the temperature compensation member, and consequently, the edge of the substrate increases in temperature effectively due to an increase in the heat transfer area thereof.

According to the embodiment, the temperature compensation member includes a material that has excellent resistance to corrosion by cleaning gas or etching gas, which is introduced into a chamber of a substrate-processing apparatus, high thermal absorptivity and high thermal conductivity, and is therefore capable of effectively and sustainably transferring heat to the edge of the substrate, thereby improving the thickness distribution of a thin film to be deposited on the edge of the substrate.

BEST MODE

Hereinafter, embodiments will be described in detail with reference to the accompanying drawings. While the disclosure is susceptible to various modifications and alternative forms, specific embodiments thereof are shown by way of example in the drawings and are explained in detail in the description. However, the disclosure should not be construed as being limited to the embodiments set forth herein, but on the contrary, the disclosure is intended to cover all modifications, equivalents, and alternatives falling within the spirit and scope of the embodiments.

It may be understood that, although the terms "first," "second," etc. may be used herein to describe various elements, these elements are not to be construed as being limited by these terms. These terms are generally only used to distinguish one element from another. In addition, terms particularly defined in consideration of the construction and operation of the embodiments are used only to describe the embodiments, but do not define the scope of the embodiments.

It will be understood that when an element is referred to as being "on" or "under" another element, it can be directly on/under the element, or one or more intervening elements may also be present. When an element is referred to as being "on" or "under," "under the element" as well as "on the element" can be included based on the element.

In addition, relational terms, such as "on/upper part/above" and "under/lower part/below," are used only to distinguish between one subject or element and another subject or element, without necessarily requiring or involving any physical or logical relationship or sequence between such subjects or elements.

Figure 1:
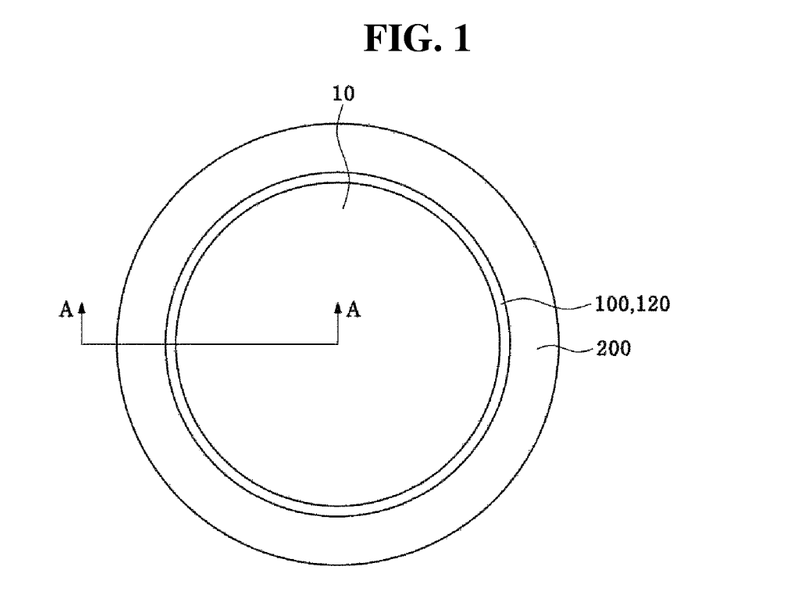
FIG. 1 is a plan view illustrating a substrate supporting apparatus according to an embodiment.
Figure 2:
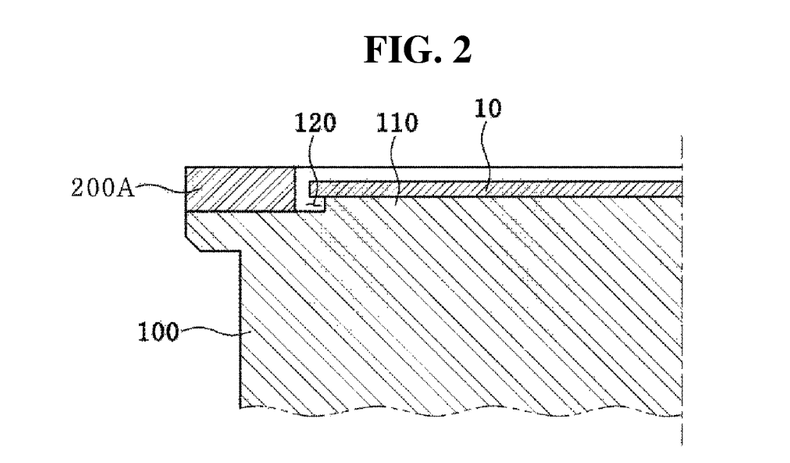
FIG. 2 is a cross-sectional view taken in the direction A-A in FIG. 1.

FIG. 1 is a plan view illustrating a substrate supporting apparatus according to an embodiment. FIG. 2 is a cross-sectional view taken in the direction A-A in FIG. 1.

A substrate supporting apparatus of the embodiment is disposed in a chamber (not shown), in which a process of manufacturing a substrate 10, such as a deposition process, an etching process, or the like, is performed. The substrate supporting apparatus may be configured to allow the substrate 10 to be seated thereon, and may support the substrate 10 while the substrate-manufacturing process is performed.

Although not illustrated, the chamber may be provided therein with a spray unit for spraying process gas or purge gas, including a source material, to the substrate 10. In addition, a substrate-processing apparatus including the above-described chamber may be provided with an exhaust device, such as a vacuum pump or the like, to allow the interior of the chamber to be maintained in a vacuum state or at a pressure close to a vacuum.

In addition, the substrate-processing apparatus may further include a plasma-generating device, which is disposed inside the chamber to manufacture the substrate.

The substrate supporting apparatus of the embodiment may include a support member 100 and a temperature compensation member 200. The support member 100 may be configured to allow the substrate 10 to be seated on the top surface thereof, and may support the substrate 10 while the substrate-manufacturing process is performed. Here, the temperature compensation member 200 may indirectly heat an edge of the substrate 10 in order to compensate for a decrease in the temperature or to further increase the temperature of the edge of the substrate 10.

The temperature compensation member 200, as shown in FIGS. 1 and 2, may be disposed at the edge of the support member 100, and may serve to compensate for the temperature of the substrate 10.

At this time, the temperature compensation member 200 receives heat from a heater (not shown), provided at the chamber, and transfers the heat to the substrate 10 so as to further heat the edge of the substrate 10, seated on the support member 100, thereby compensating for or further increasing the temperature of the edge of the substrate 10.

During the substrate-manufacturing process, the substrate 10 may be heated by the heater provided at the chamber. The substrate-manufacturing process may be performed in the state in which the substrate 10 is heated to a high temperature by the heater.

At this time, the entire region of the substrate 10 may have a uniform temperature distribution, or the temperature of the edge of the substrate 10 may need to be increased further. If the entire region of the substrate 10 has a non-uniform temperature distribution, it may cause a non-uniform deposition thickness or a non-uniform etching thickness on the substrate 10, leading to defects in the substrate 10.

Alternatively, in some cases, during a semiconductor process, the temperature of the edge of the substrate 10 may need to be increased so as to be higher than the temperature of the center of the substrate 10.

Particularly, heat dissipation to the outside may occur more actively at the edge of the substrate 10, at which the side surface, the top surface and a portion of the bottom surface of the substrate are exposed, than at the center of the substrate 10, at which only the top surface of the substrate is exposed.

In addition, heat dissipation to the outside may also occur more actively at the edge of the support member 100, supporting the substrate 10, at which the side surface and a portion of the top surface of the support member are exposed, than at the top surface of the support member 100 on which the substrate 10 is seated.

For this reason, when the substrate 10 is heated to a high temperature, the temperature of the edge of the substrate 10 may be lower than the temperature of the center of the substrate 10.

Thus, the temperature compensation member 200 further heats the edge of the substrate 10 so as to compensate for the temperature of the edge of the substrate 10, which is lower than the temperature of the center of the substrate 10, with the result that the entire region of the substrate 10 has a uniform temperature distribution or that the edge of the substrate 10 has a temperature higher than that of the center of the substrate 10. In this manner, the temperature compensation member 200 may serve to improve the thickness distribution of a thin film to be deposited on the edge of the substrate. In addition, the temperature compensation member 200 may serve to minimize or prevent a decrease in the temperature of the entire region of the substrate 10.

In order to further heat the edge of the substrate 10, the temperature compensation member 200 needs to be disposed adjacent to the edge of the substrate 10. That is, the temperature compensation member 200 may be disposed so as to surround the substrate 10.

For example, as shown in FIG. 1, when the substrate 10 is a wafer having a disc shape, the temperature compensation member 200 may be formed in a ring shape so as to correspond to the shape of the substrate 10.

Temperature compensation members 200A, 200B, 200C, 200D and 200E, respectively illustrated in FIGS. 2 to 6, which will be described later, are various examples of the temperature compensation member 200 illustrated in FIG. 1.

Referring to FIG. 2, in the substrate supporting apparatus of the embodiment, the temperature compensation member 200A may be disposed such that the side surface thereof faces the side surface of the substrate 10. The substrate 10 and the temperature compensation member 200A may be arranged so as to be spaced apart from each other.

If the temperature compensation member 200A is in direct contact with the substrate 10, an excessive amount of heat may be transferred to the edge of the substrate 10 and/or to a neighboring portion of the edge thereof from the temperature compensation member 200A, which has higher thermal conductivity than the support member 100, by thermal conduction.

In this case, the temperature of the edge of the substrate 10 or the peripheral portion of the edge thereof may become excessively higher than the temperature of the center of the substrate 10, which may cause a non-uniform temperature distribution over the entire region of the substrate 10.

In order to prevent this non-uniform temperature distribution of the substrate 10, the embodiment adopts the above-described configuration in which the temperature compensation member 200A does not directly contact the substrate 10.

In addition, the configuration in which the temperature compensation member 200A does not directly contact the substrate 10 may make it easy to seat the substrate 10 onto the substrate supporting apparatus or to separate the substrate 10 from the substrate supporting apparatus, and may also effectively suppress the occurrence of wear and damage to the temperature compensation member 200A or the substrate 10 attributable to contact between the temperature compensation member 200A and the substrate 10.

The support member 100 and the temperature compensation member 200A may be formed of different materials from each other, and the temperature compensation member 200A may be coupled to the support member 100. At this time, the temperature compensation member 200A may be coupled to the support member 100 using a fastening member.

In the embodiment, the temperature compensation member 200A may be formed of a material that has thermal conductivity higher than that of the material of the support member 100.

In the embodiment, the temperature compensation member 200A may be formed of a material that has thermal absorptivity higher than that of the material of the support member 100. The larger the amount of heat that is absorbed in the temperature compensation member 200A, the larger the amount of heat that may be dissipated from the temperature compensation member 200A to the edge of the substrate 10. The heat dissipated from the temperature compensation member 200A may compensate for or further increase the temperature of the edge of the substrate 10.

In the embodiment, the temperature compensation member 200A may be formed of a material that has excellent resistance to corrosion by cleaning gas or etching gas, which is introduced into the chamber of the substrate-processing apparatus. The reason for forming the temperature compensation member using a material having excellent resistance to corrosion by cleaning gas or etching gas is to ensure long-term use in a high-temperature vacuum environment. At this time, the cleaning gas or the etching gas may be fluorine or a fluorine compound, which includes a halogen family element such as CF4. The temperature compensation member 200A may be exposed to the cleaning gas or the etching gas maintained in the original state thereof, or may be exposed to the cleaning gas or the etching gas activated by plasma.

Here, the above-described material having excellent corrosion resistance may include at least one of silicon carbide (SiC), aluminum oxide (Al2O3) or ceramic. However, this is merely exemplary.

Since the temperature compensation member 200A has higher thermal conductivity than the support member 100, heat is effectively transferred from the temperature compensation member 200A to the edge of the substrate 10 even though the temperature compensation member 200A has a smaller volume than the support member 100. Therefore, the edge of the substrate 10 is effectively heated, and thus the temperature of the edge of the substrate 10 may be increased so as to be higher than the temperature of the center of the substrate 10.

That is, compared to the support member 100, the temperature compensation member 200A having relatively high thermal conductivity may quickly absorb heat transferred from the heater, which is provided at the chamber, and may quickly transfer the heat to the edge of the substrate 10.

Accordingly, the edge of the substrate 10 may effectively receive heat from the temperature compensation member 200A, and thus the temperature distribution over the entire region of the substrate 10 may become uniform.

In order to ensure that the thermal conductivity of the temperature compensation member 200A is higher than that of the support member 100, for example, the support member 100 may be formed of quartz, and the temperature compensation member 200A may be formed of a material that approximates a black body, or may be coated on the surface thereof with a material that approximates a black body. However, the disclosure is not limited thereto.

A black body is an ideal material, and thus the term "black body" used in the following description refers to a material that has properties approximate to those of the black body. Here, the black body may refer to a material that has excellent heat transfer efficiency, i.e. excellent heat absorption and heat dissipation efficiency. The black body may be, for example, graphite, aluminum oxide (Al2O3), a mixed material of aluminum oxide and impurities, or the like. However, the disclosure is not limited thereto.

The support member 100 may be formed of a light-permeable i.e., light-transmissive or transparent material, and the temperature compensation member 200A may be formed of a light-impermeable i.e., an opaque material for blocking out light. For example, the support member 100 may be formed of light-permeable i.e., transparent quartz, and the temperature compensation member 200A may be formed of a light-impermeable i.e., an opaque black body. However, the disclosure is not limited thereto.

Since the support member 100 is formed of a light-permeable material, the temperature thereof may be lower than that of the temperature compensation member 200A, which is formed of a light-impermeable material.

For example, not all of the heat transferred from the heater to the light-permeable support member 100 may be used to heat the support member 100, but some of the heat may be dissipated to the outside by a thermal radiation phenomenon. The reason for this is that, because the support member 100 is light-permeable, radiant heat may be dissipated to the outside through the support member 100.

On the other hand, the heat transferred from the heater to the temperature compensation member 200A is not dissipated to the outside through the light-impermeable temperature compensation member 200A in the form of radiant heat. Therefore, the heat transferred from the heater may effectively heat the temperature compensation member 200A.

For the above reason, in the embodiment, when the substrate supporting apparatus is heated by the heater during the substrate-manufacturing process, the light-impermeable temperature compensation member 200A may have a temperature higher than that of the light-permeable support member 100.

Since the light-impermeable temperature compensation member 200A may have a temperature higher than that of the light-permeable support member 100, heat may be effectively transferred from the light-impermeable temperature compensation member 200A to the edge of the substrate 10, thus achieving uniform temperature distribution over the entire region of the substrate 10.

In addition, for example, the heater may be a radiative-type heater. In the case in which the heater is disposed at the lower side of the substrate supporting apparatus, the radiant heat emitted from the heater may pass through the light-permeable support member 100, and thus may easily heat the light-impermeable temperature compensation member 200A.

Referring to FIG. 2, the support member 100 of the embodiment may include a seat portion 110 and a depressed portion 120. The seat portion 110 may be formed so as to allow the substrate 10 to be seated thereon.

The depressed portion 120 may be formed between the seat portion 110 and the inner side surface of the temperature compensation member 200A, and may be formed in a ring shape so as to correspond to the circular-shaped substrate 10 and the ring-shaped temperature compensation member 200A. That is, the depressed portion 120 may be formed around the circumference of the seat portion 110, which protrudes further than the depressed portion 120.

Referring to FIG. 2, the depressed portion 120 may be defined by the side surface of the temperature compensation member 200A and the side surface of the seat portion 110.

Due to this configuration, when the substrate 10 is seated on the seat portion 110, the edge of the substrate 10 may be located above the depressed portion 120 such that the side and bottom surfaces of the edge of the substrate 10 are exposed. Therefore, the substrate 10 may be located adjacent to the temperature compensation member 200A such that the side surface of the substrate 10 is spaced apart from the temperature compensation member 200A.

In addition, since the top, side and bottom surfaces of the edge of the substrate 10 are all exposed, heat transfer from the temperature compensation member 200A to the edge of the substrate 10 may be effectively realized without being impeded by the support member 100.

Therefore, the top, side and bottom surfaces of the edge of the substrate 10 may be heated by the heat dissipated from the temperature compensation member 200A, and consequently, the edge of the substrate 10 may be effectively heated due to an increase in the heat transfer area thereof.

Figure 3:
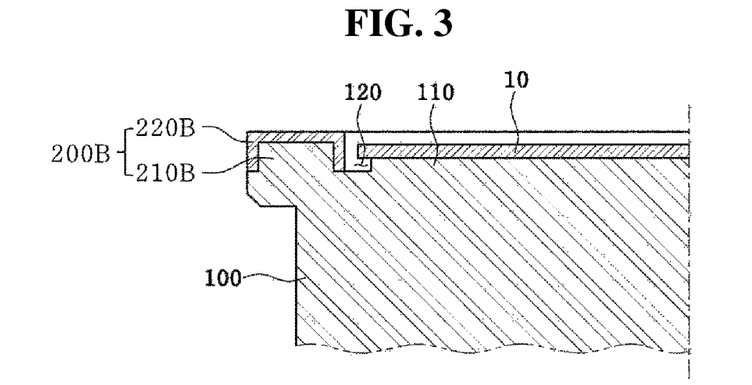
FIG. 3 is a cross-sectional view illustrating another embodiment of FIG. 2.

FIG. 3 is a cross-sectional view illustrating another embodiment of FIG. 2. As shown in FIG. 3, the temperature compensation member 200B may include a body portion 210B and a coating layer 220B.

The body portion 210B may be formed of the same material as the support member 100, and may be formed integrally with the support member 100. The coating layer 220B may be coated on the surface of the body portion 210B, and may be formed of a different material from the body portion 210B.

If the support member 100 and the temperature compensation member 200 are formed of different materials from each other, the support member 100 and the temperature compensation member 200 may have different coefficients of thermal expansion from each other. Thus, when the substrate supporting apparatus is heated to a high temperature, the substrate supporting apparatus may be deformed or damaged due to a difference in the coefficient of thermal expansion between the support member 100 and the temperature compensation member 200.

Therefore, in the embodiment illustrated in FIG. 3, the body portion 210B of the temperature compensation member 200B is formed of the same material as the support member 100, thus effectively preventing deformation or damage to the substrate supporting apparatus attributable to the difference in the coefficient of thermal expansion described above.

Since the body portion 210B is formed integrally with the support member 100, as shown in FIG. 3, the bottom surface of the body portion 210B may be integrally connected with the support member 100, and the coating layer 220B may be disposed on both side surfaces and the top surface of the body portion 210B.

In addition, the coating layer 220B may be formed of a material that has thermal conductivity higher than that of the material of the body portion 210B. For example, the coating layer 220B may be formed of ceramic.

The support member 100 may be formed of quartz, and at least a portion of the temperature compensation member 200B may be formed of a black body. That is, the support member 100 and the body portion 210B may be formed of quartz, and the coating layer 220B may be formed of a material that is approximate to a black body. Here, the material that is approximate to a black body may include at least one of silicon carbide (SiC), black ceramic, aluminum oxide (Al2O3), graphite, or black quartz. However, this is merely exemplary.

In addition, the support member 100 and the body portion 210B may be formed of light-permeable i.e., transparent quartz, and the coating layer 220B may be formed of a light-impermeable i.e., an opaque black body.

Figure 4:
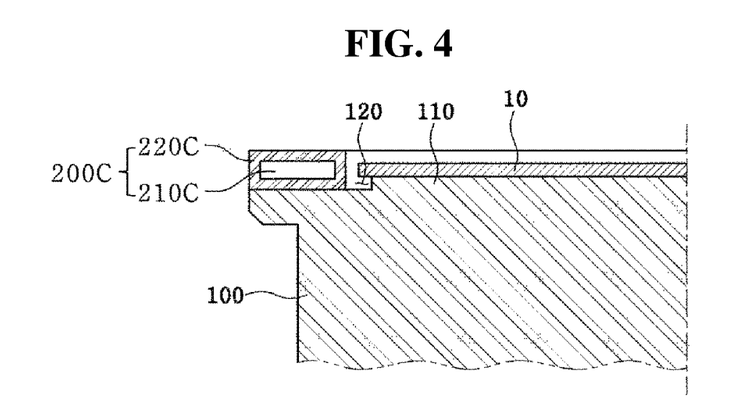
FIG. 4 is a cross-sectional view illustrating a further embodiment of FIG. 2.

FIG. 4 is a cross-sectional view illustrating a further embodiment of FIG. 2. Like the embodiment of FIG. 3, in the embodiment of FIG. 4, the temperature compensation member 200C includes a body portion 210C and a coating layer 220C coated on the surface of the body portion 210C.

However, unlike the embodiment of FIG. 3, in the embodiment of FIG. 4, the temperature compensation member 200C may be manufactured separately from the support member 100, and may be coupled to the support member 100. At this time, the temperature compensation member 200C may be coupled to the support member 100 using a fastening member.

Referring to FIG. 4, in this embodiment, the coating layer 220C may be disposed on both side surfaces and the top and bottom surfaces of the body portion 210C. Therefore, when viewed in cross-section, the temperature compensation member 200C may be configured such that the coating layer 220C wraps the body portion 210C.

Like the embodiment of FIG. 3, in the embodiment of FIG. 4, the body portion 210C of the temperature compensation member 200C may be formed of the same material as the support member 100, thereby effectively preventing deformation or damage to the substrate supporting apparatus attributable to the difference in the coefficient of thermal expansion described above.

Figure 5:
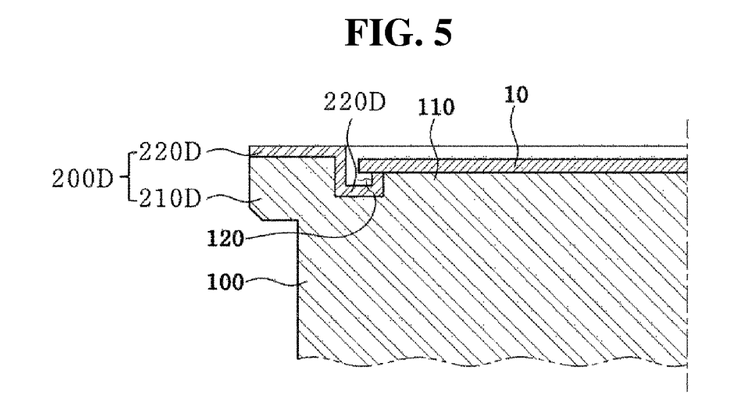
FIG. 5 is a cross-sectional view illustrating a further embodiment of FIG. 2.

FIG. 5 is a cross-sectional view illustrating a further embodiment of FIG. 2. Like the previous embodiments, in the embodiment of FIG. 5, the temperature compensation member 200D includes a body portion 210D and a coating layer 220D coated on the surface of the body portion 210D. The body portion 210D may be formed integrally with the support member 100.

The body portion 210D and the coating layer 220D may be formed of different materials from each other. The coating layer 220D may be formed of a material that has thermal conductivity higher than that of the material of the body portion 210D. A duplicate explanation of the same configuration as that of the above-described embodiments of FIGS. 3 and 4 will be omitted.

Referring to FIG. 5, the coating layer 220D may be formed such that a portion thereof is disposed on the side and lower surfaces of the depressed portion 120 and such that one end thereof comes into contact with the bottom surface of the edge of the substrate 10.

Due to this configuration, the surface area of the coating layer 220D that faces the exposed portions of the side surface and the edge of the substrate 10 is increased. Therefore, the amount of heat to be transferred from the coating layer 220D to the side surface and the edge of the substrate 10 is increased, and consequently, it may be possible to effectively compensate for the temperature of the edge of the substrate 10.

In addition, since one end of the coating layer 220D is in contact with the bottom surface of the edge of the substrate 10, heat may be transferred from the coating layer 220D to the edge of the substrate 10 by thermal conduction.

Since the heat transfer from the coating layer 220D to the edge of the substrate 10 occurs actively due to the thermal conduction, it may be possible to more effectively compensate for the temperature of the edge of the substrate 10.

Figure 6:
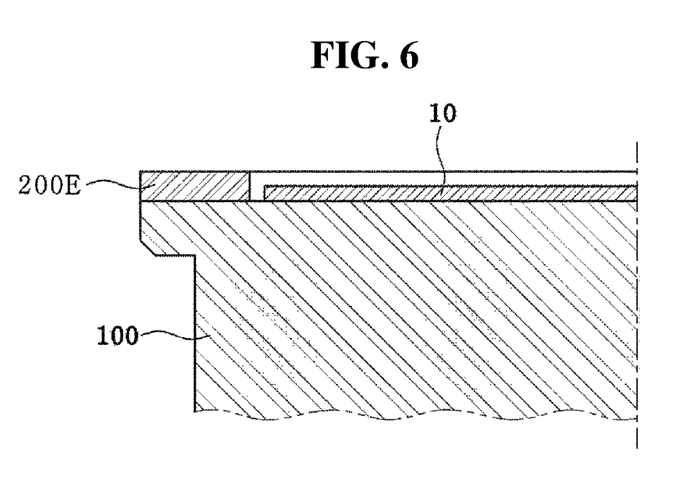
FIG. 6 is a cross-sectional view illustrating a further embodiment of FIG. 2.

FIG. 6 is a cross-sectional view illustrating a further embodiment of FIG. 2. In this embodiment, the temperature compensation member 200E and the substrate 10 may be disposed on the top surface of the support member 100.

Like the previous embodiments, the temperature compensation member 200E and the substrate 10 may be arranged such that the side surfaces thereof are spaced apart from each other and face each other.

At this time, the bottom surface of the temperature compensation member 200E and the bottom surface of the substrate 10 may be disposed at the same height in the vertical direction. That is, the temperature compensation member 200E and the substrate 10 may be disposed in the same plane. Here, "the same plane" may refer to the top surface of the support member 100.

Therefore, unlike the previous embodiments, this embodiment may not include either the above-described seat portion 110, which protrudes from the top surface of the support member 100, or the above-described depressed portion 120, which is depressed from the top surface of the support member 100.

Due to this configuration, in the embodiment of FIG. 6, the formation of the support member 100 may be easily realized.

In addition, since the bottom surface of the temperature compensation member 200E and the bottom surface of the substrate 10 are disposed in the same plane, the surface area of the side surface of the temperature compensation member 200E that faces the side surface of the substrate 10 may be maximized, and thus heat transfer from the temperature compensation member 200E to the edge of the substrate 10 may be effectively realized.

Figure 7:
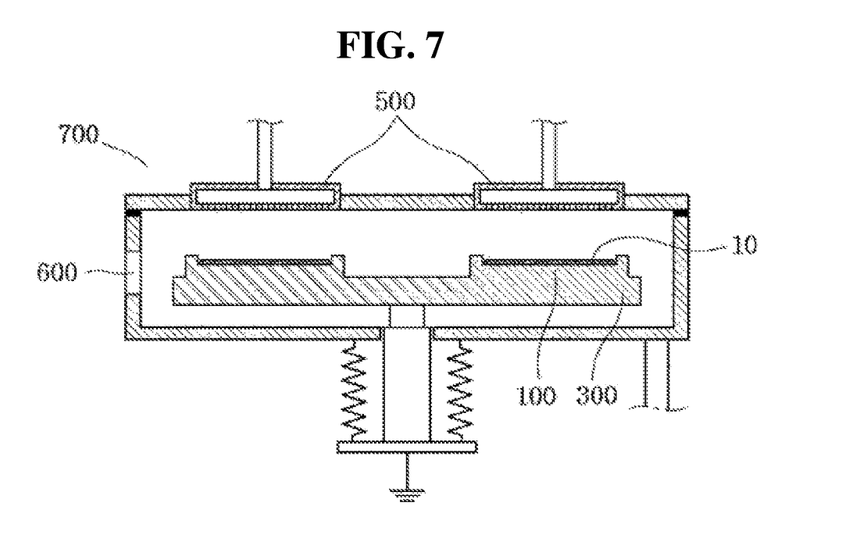
FIG. 7 is a cross-sectional view illustrating a substrate-processing apparatus to which the embodiment of FIG. 1 is applied.

FIG. 7 is a cross-sectional view illustrating a substrate-processing apparatus 700 to which the embodiment of FIG. 1 is applied. The substrate-processing apparatus 700 may include a chamber 600, which defines a reaction space for processing a substrate 10, at least one support member 100 provided inside the chamber 600 to support the substrate 10 seated thereon, a support member carrier 300, which accommodates the support member 100 and allows the support member 100 to be movable about a center axis inside the chamber 600, and a gas spray unit 500, which sprays process gas to the substrate 10 seated on the support member 100.

The substrate-processing apparatus 700 may include a heater (not shown), which is provided at the lower side of the support member carrier 300 to heat the substrate 10. For example, the heater may be an optical heater. The light emitted from the optical heater may pass through the support member carrier 300 and the support member 100 in sequence, and may heat the substrate 10. At this time, the support member carrier 300 may be formed of the same material as the support member 100.

The heater may not be an optical heater, but may alternatively be an induction heater or a resistance heater. The heater may alternatively be disposed inside the support member carrier 300.

The support member 100 may protrude from the support member carrier 300 in the upward direction of the chamber 600. The substrate 10 seated on the support member 100 may be located at a position higher than the top surface of the support member carrier 300. The support member 100 may be coupled to or separated from the support member carrier 300. In the case in which two or more support members 100 are coupled to the support member carrier 300, the support members 100 may be removably coupled to the support member carrier 300.

In the substrate-processing apparatus 700, when the support member 100 protrudes from the top surface of the support member carrier 300, the edge of the top surface of the support member 100 and the side surface thereof are exposed to the reaction space, and thus experience higher heat loss than the portion of the support member 100 on which the substrate is seated. The edge of the substrate, seated on the support member 100, may experience higher heat loss than the center of the substrate. Therefore, by installing the temperature compensation member 200, described above with reference to FIGS. 1 to 6, to the support member 100, the heat dissipated from the temperature compensation member 200 compensates for the heat loss of the edge of the substrate 10, thereby ensuring uniform temperature distribution over the substrate. In addition, the temperature of the edge of the substrate may be increased further depending on the circumstances.

Since other effects obtained by the configuration of the substrate supporting apparatus, described with reference to FIGS. 3 to 6, are identical or similar to the effects described above with reference to FIGS. 1 and 2, a duplicate explanation thereof will be omitted.

Although only a limited number of embodiments have been described above, various other embodiments are possible. The technical contents of the above-described embodiments may be combined into various forms as long as they are not incompatible with one another, and thus may be implemented in new embodiments.

Mode for Invention

The mode for invention has been fully explained in the "Best Mode" as described above.

INDUSTRIAL APPLICABILITY

Embodiments relate to a substrate supporting apparatus and have industrial applicability therein.

The invention claimed is:

1. A substrate supporting apparatus comprising:
a support member for supporting a substrate; and
a temperature compensation member disposed at an edge of the support member,
wherein the support member is formed of a transparent material, and the temperature compensation member is formed of an opaque material, and
wherein the temperature compensation member comprises:
a surface formed of a material having resistance to corrosion by cleaning gas;
a body portion formed of a same material as the support member; and
a coating layer coated on a surface of the body portion, the coating layer being formed of a different material from the body portion.

2. The substrate supporting apparatus according to claim 1, wherein the temperature compensation member comprises a surface coated with a material having resistance to corrosion by cleaning gas.

3. The substrate supporting apparatus according to claim 1, wherein the support member is formed of quartz, and the temperature compensation member is formed of at least one selected from the group consisting of silicon carbide (SiC), black ceramic, black quartz, and graphite.

4. The substrate supporting apparatus according to claim 1, wherein the substrate and the temperature compensation member are spaced apart from each other such that a side surface of the substrate and a side surface of the temperature compensation member face each other.

5. The substrate supporting apparatus according to claim 1, wherein the temperature compensation member is formed of a material having thermal conductivity higher than a material of the support member.

6. The substrate supporting apparatus according to claim 1, wherein the coating layer is formed of a material having thermal conductivity higher than a material of the body portion.

7. The substrate supporting apparatus according to claim 6, wherein the support member and the body portion are formed of quartz, and the coating layer is formed of a black body.

8. The substrate supporting apparatus according to claim 1, wherein the temperature compensation member is formed in a shape of a ring that is disposed so as to surround the substrate.

9. The substrate supporting apparatus according to claim 1, wherein the support member comprises:
a seat portion on which the substrate is seated; and
a depressed portion having a ring shape, the depressed portion being formed between the seat portion and an inner side surface of the temperature compensation member.

10. The substrate supporting apparatus according to claim 9, wherein the substrate is disposed on the depressed portion such that side and bottom surfaces of an edge of the substrate are exposed.

11. The substrate supporting apparatus according to claim 10, wherein the temperature compensation member dissipates heat, and the heat dissipated from the temperature compensation member heats top, side and bottom surfaces of the edge of the substrate.

12. The substrate supporting apparatus according to claim 1, wherein the temperature compensation member and the substrate are disposed on a top surface of the support member such that a bottom surface of the temperature compensation member and a bottom surface of the substrate are disposed at a same height in a vertical direction.

13. A substrate supporting apparatus comprising:
a support member for supporting a substrate; and
a temperature compensation member disposed at an edge of the support member, the temperature compensation member being formed of a different material from the support member,
wherein the support member comprises:
a seat portion on which the substrate is seated; and
a depressed portion having a ring shape, the depressed portion being formed between the seat portion and an inner side surface of the temperature compensation member,
wherein the temperature compensation member comprises:
a surface formed of a material having resistance to corrosion by cleaning gas;
a body portion formed of a same material as the support member; and
a coating layer coated on a surface of the body portion, the coating layer being formed of a different material from the body portion, and
wherein the substrate is disposed on the depressed portion such that side and bottom surfaces of an edge of the substrate are exposed and are heated by heat dissipated from the temperature compensation member.

14. The substrate supporting apparatus according to claim 13, wherein the temperature compensation member is formed of a material having thermal conductivity higher than a material of the support member.

15. The substrate supporting apparatus according to claim 14, wherein the support member is formed of quartz, and at least a portion of the temperature compensation member is formed of a black body.

16. The substrate supporting apparatus according to claim 13,
wherein the coating layer is formed such that a portion of the coating layer is disposed on side and lower surfaces of the depressed portion and such that one end of the coating layer comes into contact with a bottom surface of the edge of the substrate.

17. The substrate supporting apparatus according to claim 16, wherein the coating layer is formed of a material having thermal conductivity higher than a material of the body portion.

18. The substrate supporting apparatus according to claim 13, wherein the temperature compensation member comprises a surface coated with a material having resistance to corrosion by cleaning gas.

19. The substrate supporting apparatus according to claim 7, wherein the black body comprises at least one selected from the group consisting of silicon carbide (SiC), ceramic, aluminum oxide (Al2O3), graphite, and quartz.

* * * * *